(12) United States Patent
Clinton (10) Patent No.: US 8,995,164 B2
(45) Date of Patent: Mar. 31, 2015

(54) HIGH-PERFORMANCE SCALABLE READ-ONLY-MEMORY CELL

(71) Applicant: Texas Instruments Incorporated, Dallas, TX (US)

(72) Inventor: Michael Patrick Clinton, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 177 days.

(21) Appl. No.: 13/929,121

(22) Filed: Jun. 27, 2013

(65) Prior Publication Data

US 2014/0140121 A1    May 22, 2014

Related U.S. Application Data

(60) Provisional application No. 61/727,497, filed on Nov. 16, 2012.

(51) Int. Cl.
  *G11C 17/00*    (2006.01)
  *G11C 17/08*    (2006.01)

(52) U.S. Cl.
  CPC .................................... *G11C 17/08* (2013.01)
  USPC .......................................... 365/104; 365/103

(58) Field of Classification Search
  USPC .................................... 365/104, 103, 189.03
  See application file for complete search history.

(56) References Cited

U.S. PATENT DOCUMENTS

| 7,394,719 B2 * | 7/2008 | Lee et al. ................. 365/230.06 |
| 2007/0002645 A1 * | 1/2007 | Roehr et al. .................. 365/195 |
| 2008/0170426 A1 | 7/2008 | Liaw | |

OTHER PUBLICATIONS

Dozaka et al., "A 38% Access Time Improvement in 40 nm CMOS Technology with Triple-Wire-Program-Cell Scheme for High Density MROM", Digest of Technical Papers, 2013 Symposium on VLSI Circuits (Jun. 12-14, 2013), pp. 206-207.

Wu et al., "A 28nm ROM with Two-Step Decoding Scheme and OD-Space-Effect Minimization to Achieve 30% Speed and 190mV Vmin Improvement", Digest of Technical Papers, 2013 Symposium on VLSI Circuits (Jun. 12-14, 2013), pp. 208-209.

* cited by examiner

*Primary Examiner* — Vu Le
(74) *Attorney, Agent, or Firm* — Rose Alyssa Keagy; Frank D. Cimino (57) ABSTRACT

A two-bit read-only-memory (ROM) cell and method of sensing its data state. Each ROM cell in an array includes a single n-channel metal-oxide-semiconductor (MOS) transistor with a source biased to a reference voltage, and its drain connected by a contact or via to one or none of first, second, and third bit lines associated with its column in the array. Each row in the array is associated with a word line serving as the transistor gates for the cells in that row. In response to a column address, a column select circuit selects one pair of the three bit lines to be applied to a sense line in wired-NOR fashion for sensing.

19 Claims, 8 Drawing Sheets

HIGH-PERFORMANCE SCALABLE READ-ONLY-MEMORY CELL

CROSS-REFERENCE TO RELATED APPLICATIONS

This application claims priority, under 35 U.S.C. §119(e), of Provisional Application No. 61/727,497, filed Nov. 16, 2012, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state semiconductor memories. Embodiments of this invention are more specifically directed to memory cells and architectures for read-only memories.

Non-volatile solid-state memory devices are now commonplace in many electronic systems, particularly in portable electronic devices and systems. Mask-programmable read-only memories (ROMs) constitute one conventional type of non-volatile semiconductor memory. While read/write non-volatile memory technology such as electrically erasable programmable "read-only" memory (EEPROM) devices, "flash" EEPROMs, ferroelectric random-access memories (FRAMs) are currently available, mask-programmable ROMs continue to be attractive due to their extremely small cell sizes and fast read time (for purposes of this description, mask-programmable ROMs will be referred to herein simply as "ROMs", it being understood that EEPROMs and other programmable memories also operate as "read-only" memories).

Figure 1A:
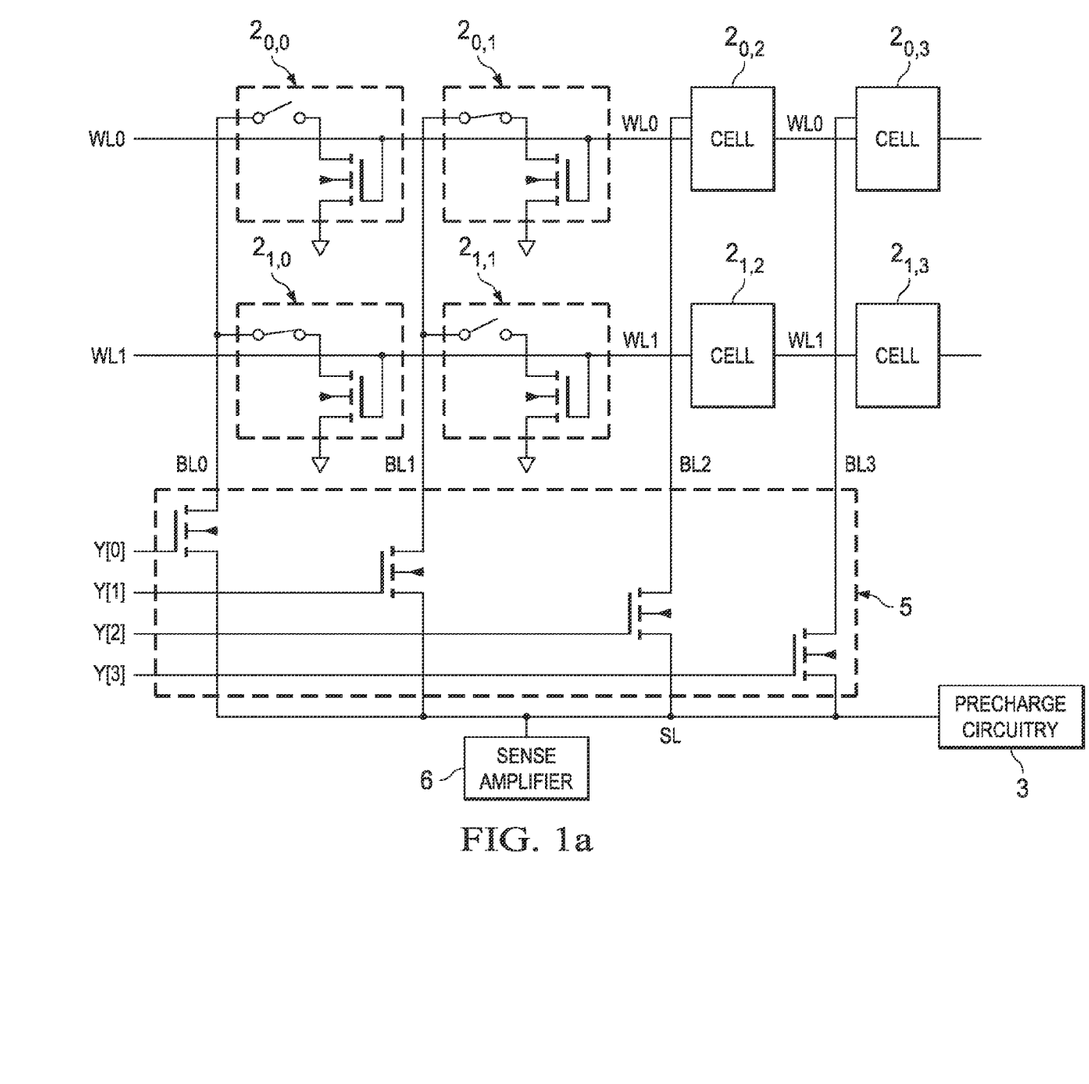
FIG. 1a is an electrical diagram, in schematic form, of a portion of an array in a conventional read-only memory (ROM).
Figure 1B:
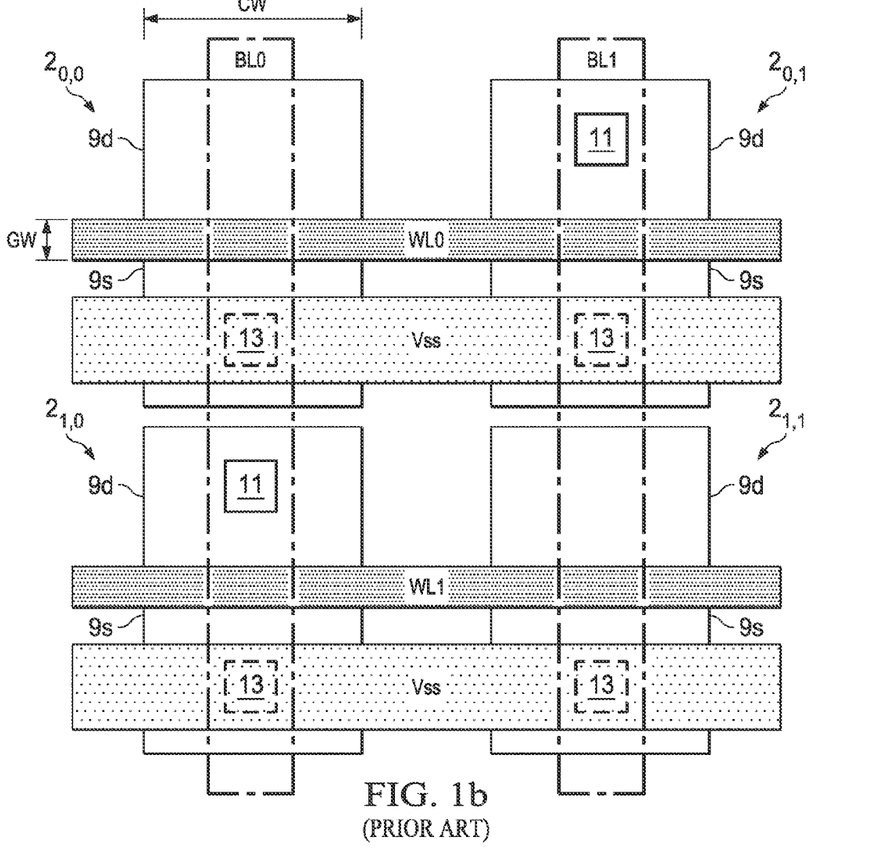
FIG. 1b is a plan view of a portion of an integrated circuit surface at which the conventional ROM memory cells in the array shown in FIG. 1a are realized.

FIGS. 1a and 1b illustrate the arrangement of conventional mask-programmable ROM cells. FIG. 1a is a simplified electrical schematic of a 2×4 portion of a conventional ROM array, showing the arrangement of ROM cells $2_{0,0}$ through $2_{1,3}$ in two rows and four columns. In this conventional example of a ROM array, cells $2_{0,0}$ through $2_{0,3}$ are in the same row, and as such receive word line WL0 for that row, while cells $2_{1,0}$ through $2_{1,3}$ are in the same row and receive word line WL1 for that row. Cells $2_{0,0}$, $2_{1,0}$ are in the same column, and are each coupled to bit line BL0, while cells $2_{0,1}$, $2_{1,1}$ are coupled to bit line BL1 for their column, cells $2_{0,2}$, $2_{1,2}$ are coupled to bit line BL2 for their column, and cells $2_{0,3}$, $2_{1,3}$ are coupled to bit line BL3 for their column. Bit lines BL0 through BL3 are each connected to sense amplifier 6 and precharge circuitry 3 via column decode multiplexer 5. Alternatively, precharge circuitry 3 may be connected to all bit lines BL0 through BL3 (e.g., on their opposite ends from column decode multiplexer 5). A word line decoder (not shown) drives one of word lines WL0, WL1 according to a decoded row address. Column decode multiplexer 5 receives decoded address signals Y[0], Y[1], Y[2], Y[3], in response to each of which the corresponding one of bit lines BL0 through BL3, respectively, is coupled to sense line SL and sense amplifier 6.

In this conventional example, each of cells 2 is constructed as a single re-channel metal-oxide-semiconductor (MOS) transistor having its gate connected to the word line WL0, WL1 for its row, and its source at ground ($V_{ss}$). The drain of the MOS transistor of each cell 2 may or may not be connected to the bit line BLx for its column, depending on the programmed data state for that cell 2. In the example of FIG. 1a, cells $2_{0,1}$ and $2_{1,0}$ are each programmed to a "0" level, by virtue of their transistor drains being connected to bit lines BL1, BL0, respectively. Conversely, cells $2_{0,0}$ and $2_{1,1}$ are each programmed to a "1" level, by virtue of their transistor drains being left floating, and not connected to bit line BL0, BL1, respectively.

In the operation of the conventional example of FIG. 1a, one of bit lines BL0 through BL3 is selected by column decode multiplexer 5, for example in response to the two least significant bits of the column address; this selection similarly selects every fourth column throughout the array. At the beginning of a read cycle while word lines WL0, WL1 remain inactive low, precharge circuitry 3 precharges the selected bit lines to a high voltage and then releases those selected bit lines, allowing them to electrically float. Following bit line precharge, one of word lines WL0, WL1 is energized in response to the row address, turning on the n-channel MOS transistors of cells 2 in that row. Those cells 2 in the selected row and the selected columns that are programmed to the "0" state will begin pull their respective bit lines toward $V_{ss}$ from the precharged level. For example, if bit line BL1 is selected and word line WL0 is then driven active high, the n-channel transistor in cell $2_{0,1}$ will discharge the precharged level at bit line BL1 because cell $2_{0,1}$ is programmed to its "0" state. Conversely, those cells 2 in the selected row and columns that are programmed to the "1" state are disconnected from their respective bit lines, and cannot pull those bit lines from their precharged voltage toward $V_{ss}$. For the example of cell $2_{0,1}$ in FIG. 1a, 1f bit line BL1 and word line WL1 are selected, bit line BL1 will remain at its precharged level because the "1" state has been programmed. After a sufficient time for the selected bit line BL0, BL1 to reach its eventual level, sense amplifier 6 is enabled to detect the level at the selected bit line BL0, BL1.

As evident from FIG. 1a, the construction of cells 2 is quite simple—each cell 2 consists of only a single transistor, with its drain either connected or not connected to bit line BLx for its column. FIG. 1b illustrates, in plan (layout) view, the construction of four cells $2_{0,0}$ through $2_{1,1}$ according to a conventional approach. In this construction, each cell 2 is constructed within an active region (e.g., a p-type well, or a p-type region of the substrate surrounded by isolation dielectric in the conventional sense). Word lines WL0, WL1 are constructed of polycrystalline silicon or another gate material, and extend across the active regions to serve as the gate electrode of the n-channel transistors of cells 2 in the corresponding rows. The active surfaces on either side of word lines WL0, WL1 are doped n-type, to form source regions 9s and drain regions 9d of those transistors in the conventional self-aligned manner. A metal conductor providing ground voltage Vss extends across each row of cells 2, parallel to word lines WL0, WL1, making contact to each source region 9s through via 13. Bit lines BL0, BL1 are formed in a different metal layer from that providing ground voltage Vss, and extend perpendicularly across cells 2 in corresponding columns. In this example, bit line BL0 extends vertically (in the view of FIG. 1b) across cells $2_{0,0}$, $2_{1,0}$, and bit line BL1 extends across cells $2_{1,0}$, $2_{1,1}$.

Each cell 2 is programmed by the presence or absence of a via 11 between its drain region 9d and its corresponding bit line BL0, BL1. In this example, no via 11 is provided for cells $2_{0,0}$, $2_{1,1}$, and as such neither of those cells is connected to its corresponding bit line BL0, BL1; these cells $2_{0,0}$, $2_{1,1}$, are thus programmed to a "1" data state. Conversely, a via 11 is provided in each of cells $2_{0,1}$, $2_{1,0}$, connecting drain region 9d to bit lines BL0, BL1, respectively. These cells $2_{0,1}$, $2_{1,0}$ are thus programmed to a "0" data state.

In this conventional construction, the read performance of ROM cell 2 is determined by the current conducted by its n-channel transistor for the "0" data state, as it is this current that determines the time required for cell 2 to discharge the precharged bit line to a voltage that can be accurately and reliably sensed by sense amplifier 6. As is fundamental in the MOS field, the current drive of the cell transistor is directly proportional to the transistor channel width/length ratio. FIG. 1b shows the transistor channel width CW and channel length (i.e., gate width) GW for cell $2_{0,0}$. For maximum device density, and thus minimum chip area required for the ROM resource, it is desirable to construct cells 2 using minimum size MOS transistors available for the manufacturing technology.

It has been observed, in connection with this invention, that the scaling of ROM transistors at technology nodes of 45 nm and smaller may be limited. One difficulty is the increased device variability at these small feature sizes, particularly in connection with the variability of threshold voltage. At these extremely small feature sizes, effects such as random dopant fluctuations, stress effects, and line edge roughness can cause significant variations in threshold voltage from transistor to transistor. This threshold voltage variability is reflected in significant variation in read current from cell-to-cell in the same array. This variation necessitates relaxation of design parameters to account for the worst case read current, for example by not scaling the ROM cell transistors along with the minimum transistor sizes of the manufacturing technology, or by reducing the bit line length, or both. These relaxed parameters result in reduced performance and larger chip area than would otherwise be expected at the available technology node.

BRIEF SUMMARY OF THE INVENTION

Embodiments of this invention provide a read-only memory (ROM) having both chip area and performance characteristics that are scalable with the minimum transistor feature sizes of the manufacturing technology.

Embodiments of this invention provide such a ROM in which such performance scaling can be attained with full length bit lines according to the desired memory organization.

Embodiments of this invention provide such a ROM in which such scaling can be attained in a manner that requires a minimum amount of decoding and multiplexer circuitry in the sense path.

Other objects and advantages of embodiments of this invention will be apparent to those of ordinary skill in the art having reference to the following specification together with its drawings.

This invention may be implemented into a mask-programmable read-only memory (ROM) array in which each addressable memory cell stores two bits of data. Each cell is constructed as a single metal-oxide-semiconductor (MOS) transistor having three potential contact locations between the drain region of the transistor and first, second, and third bit lines. The two-bit data state is programmed by placing a contact or via at a single one or none of the first, second, and third contact locations for each cell. A column decode multiplexer coupled to the three bit lines enables sensing of a logical combination of a pair of the three bit lines to recover one of the data bits stored by the addressed cell, according to an encoding scheme. The second data bit stored by that cell can be retrieved by the column decode multiplexer enabling the sensing of a logical combination of a different pair of those three bit lines.

DETAILED DESCRIPTION OF THE INVENTION

This invention will be described in connection with one or more of its embodiments, namely as implemented into mask-programmable read-only memory (ROM) constructed according to a metal-oxide-semiconductor (MOS) technology, as it is contemplated that this invention is especially beneficial when implemented in that context. However, it is also contemplated that this invention can provide benefit in other circuit and structure applications. Accordingly, it is to be understood that the following description is provided by way of example only, and is not intended to limit the true scope of this invention as claimed.

Figure 2:
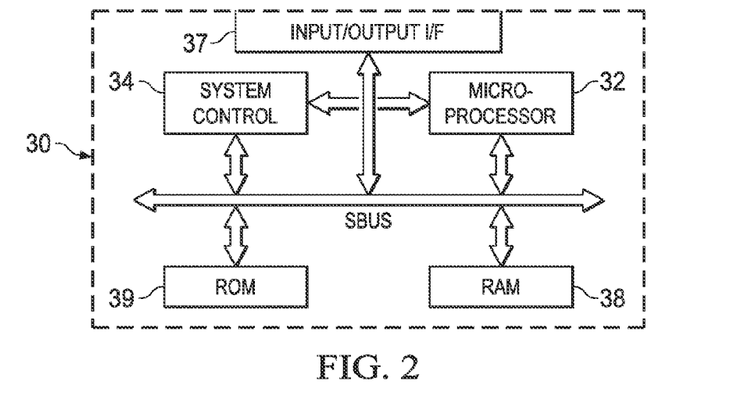
FIG. 2 is an electrical diagram, in block form, of a large scale integrated circuit constructed according to embodiments of the invention.

FIG. 2 illustrates an example of large-scale integrated circuit 30, in the form of a so-called "system-on-a-chip" ("SoC"), as now popular in many electronic systems. Integrated circuit 30 is a single-chip integrated circuit into which an entire computer architecture is realized. As such, in this example, integrated circuit 30 includes a central processing unit of microprocessor 32, which is connected to system bus SBUS. Various memory resources, including random access memory (RAM) 38 and read-only memory (ROM) 39, reside on system bus SBUS and are thus accessible to microprocessor 32. In this example, ROM 39 is realized as mask-programmable ROM, although additional "read-only" memory resources such as electrically erasable programmable read-only memory (EEPROM) may also be provided. ROM 39 typically serves as program memory, storing the program instructions executable by microprocessor 32, while RAM 38 serves as data memory. In some cases, program instructions may reside in RAM 38 for recall and execution by microprocessor 32. Other system functions are shown, in a generic sense, in integrated circuit 30 by way of system control 34 and input/output interface 37.

Those skilled in the art having reference to this specification will recognize that integrated circuit 30 may include additional or alternative functions to those shown in FIG. 2, or may have its functions arranged according to a different architecture from that shown in FIG. 2. The architecture and functionality of integrated circuit 30 is thus provided only by way of example, and is not intended to limit the scope of this invention.

Figure 3:
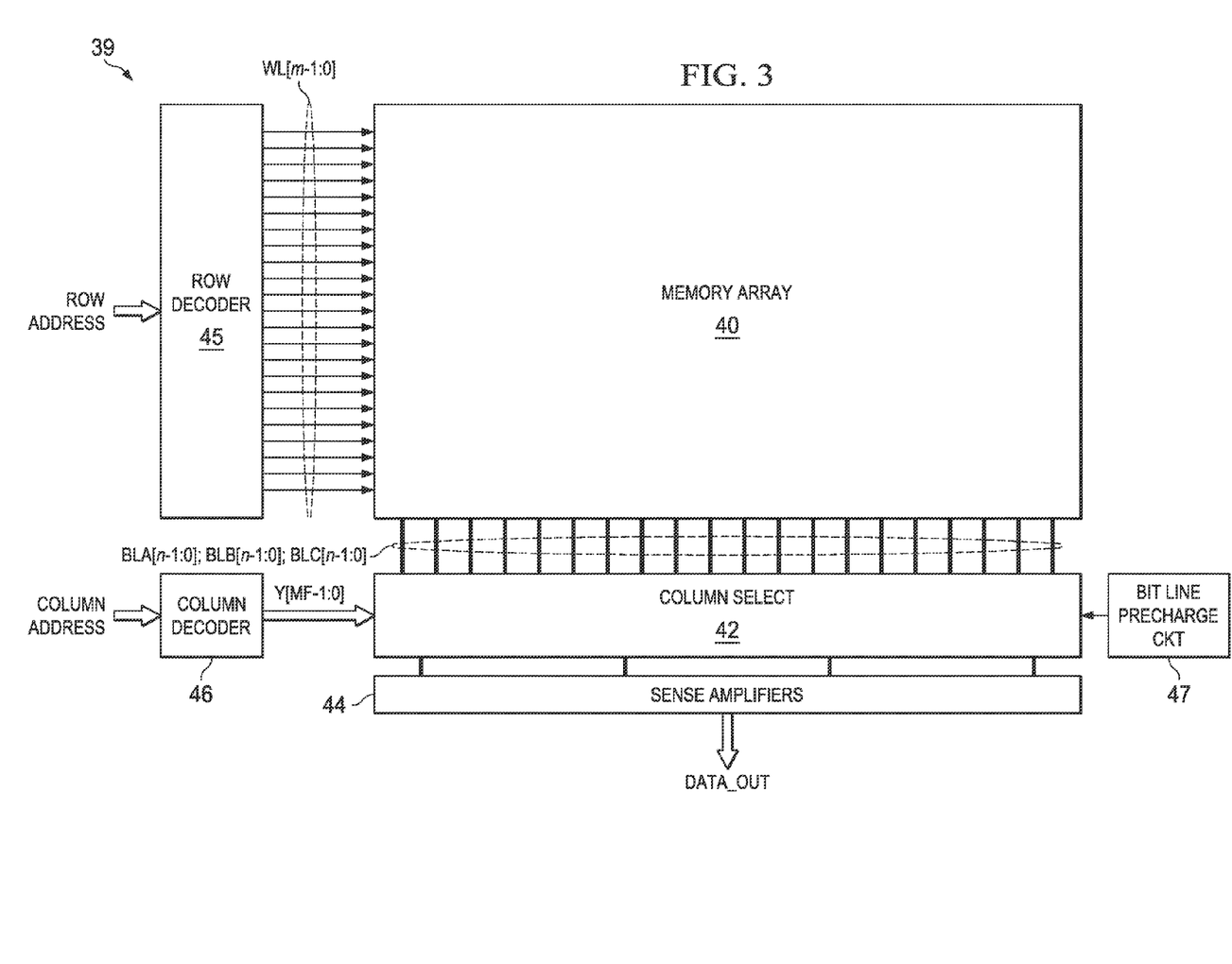
FIG. 3 is an electrical diagram, in block form, of a memory resource in the integrated circuit of FIG. 2, constructed according to embodiments of the invention.

Embodiments of this invention may be realized in integrated circuit 30 by way of ROM 39, an example of the construction of which is illustrated in FIG. 3. Alternatively, ROM 39 may correspond to a stand-alone memory integrated circuit, rather than as an embedded memory as shown in FIG. 2. Those skilled in the art having reference to this specification will comprehend that the memory architecture of ROM 39 in FIG. 3 is provided by way of example only.

In this example, ROM 39 includes memory array 40 containing read-only memory cells arranged in rows and columns. While a single instance of memory array 40 is shown in FIG. 3, it is to be understood that ROM 39 may include multiple memory arrays 40, each corresponding to a memory block within the address space of ROM 39. In the example shown in FIG. 3, memory array 40 includes m rows and n columns of ROM cells, each of which store two bits of data. In embodiments of this invention, ROM cells in the same column share three bit lines BLA[n-1:0], BLB[n-1:0], BLC[n-1:0], and ROM cells in the same row share one of word lines WL[m-1:0]. Memory array 40 may be alternatively arranged to include multiple array blocks or sub-arrays of ROM cells, depending on the addressing space or memory architecture. Row decoder 45 receives a row address value indicating the row of memory array 40 to be accessed, and energizes the one of word lines WL[m-1:0] corresponding to that row address value, which couples the ROM cells in the corresponding row to bit lines BLA[n-1:0], BLB[n-1:0], BLC[n-1:0] for the associated columns, depending on the data state stored in those cells, as will be described in further detail below.

Column decoder 46 receives at least a portion of a column address value, decodes that column address value, and generates column select signals Y[MF-1:0], which are applied to column select circuit 42. As will be described in further detail below column select circuit 42 responds to column select signals Y[MF-1:0] by coupling those bit lines BLA[n-1:0], BLB[n-1:0], BLC[n-1:0] that are associated with one or more columns selected by the column address value to one or more sense amplifiers 44. As will be described in further detail below, column select circuit 42 is constructed as one or more multiplexers, each associated with a group of columns of memory array 40, according to a multiplex factor MF and considering that each ROM cell stores two data bits in embodiments of this invention. Sense amplifiers 44 are constructed in the conventional manner, and communicate the sensed data states from the selected ROM cells to data bus DATA_OUT. Bit line precharge circuitry 47 is provided to apply a desired precharge voltage to bit lines BLA[n-1:0], BLB[n-1:0], BLC[n-1:0], in advance of each read operation. In this embodiment, precharge circuitry 47 couples to bit lines BLA[n-1:0], BLB[n-1:0], BLC[n-1:0] through column select circuit 42. Alternatively, precharge circuitry 47 may alternatively be provided on the opposite side of array 40 from column select 42, to directly precharge bit lines BLA[n-1:0], BLB[n-1:0], BLC[n-1:0].

Figure 4:
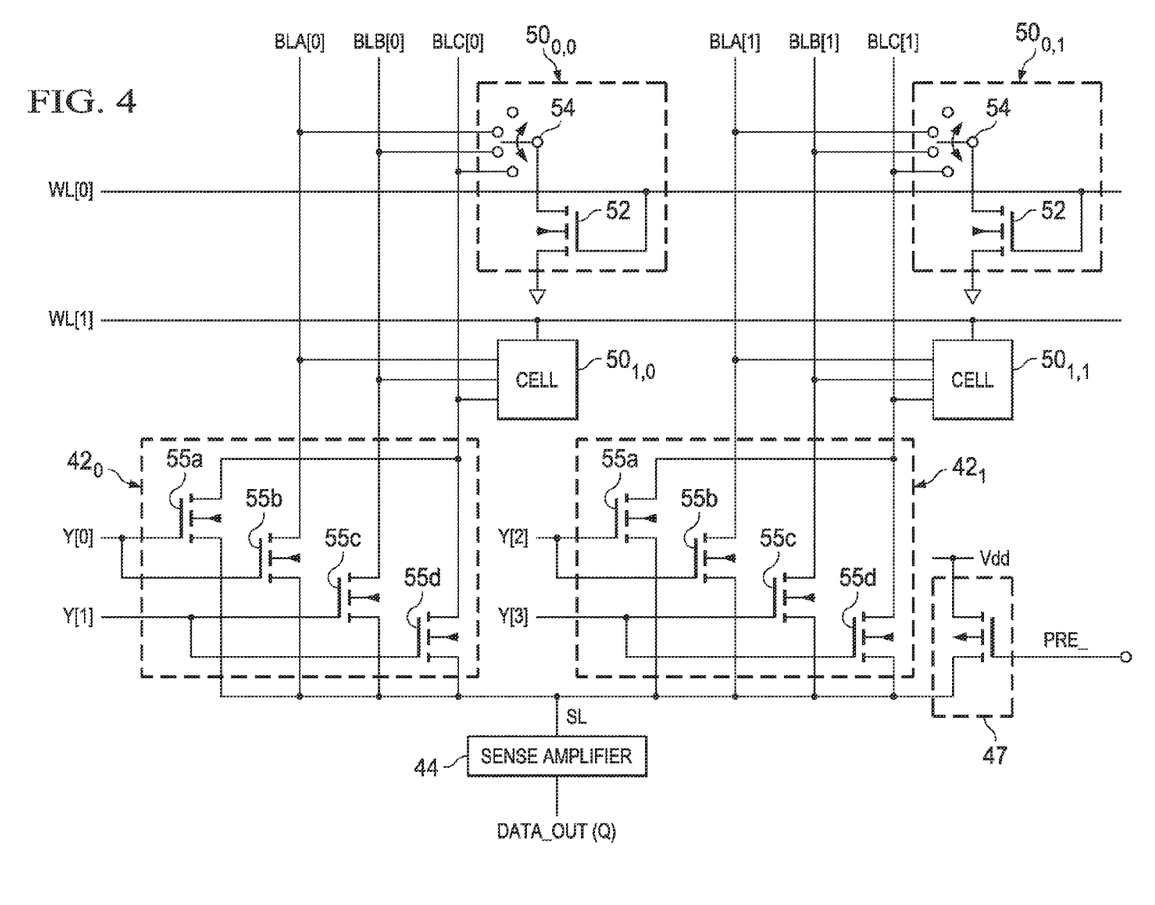
FIG. 4 is an electrical diagram, in schematic form, of a portion of the memory of FIG. 3, according to embodiments of the invention.

FIG. 4 illustrates a 2×2 portion of memory array 40, in combination with corresponding portions of column select circuit 42. In this illustration, four ROM cells 50 are shown. According to this embodiment of the invention, each ROM cell 50 stores two bits of digital data. ROM cell $50_{0,0}$ resides in row 0 and column 0, and ROM cell $50_{0,1}$ resides in row 0, and column 1. Similarly, ROM cells $50_{1,0}$ and $50_{1,1}$ reside in columns 0, 1, respectively, of row 1.

An example of the electrical construction of representative ROM cells $50_{0,0}$, $50_{0,1}$ is shown in FIG. 4, it being understood that the other cells 50 in memory array 40 will be similarly constructed. According to this embodiment of the invention, ROM cells $50_{0,0}$, $50_{0,1}$ each include an n-channel MOS transistor 52 with its source at ground voltage $V_{ss}$ and its gate connected to word line WL[0]. Referring to ROM cell $50_{0,0}$ as an example, the drain of its transistor 52 is connected to switch 54, which connects the drain of transistor 52 to one or none of the three bit lines BLA[0], BLB[0], BLC[0] associated with this column 0 of ROM cells 50 according to the programmed state of its ROM cell $50_{0,0}$. According to embodiments of this invention, switch 54 of each cell 50 will select at most one of bit lines BLA, BLB, BLC for its column, or will select none.

According to this embodiment of the invention, and as will be described below, switch 54 of cell $50_{0,0}$ is realized by the presence or absence of a contact or via openings through an insulating layer between overlying conductors corresponding to bit lines BLA[0], BLB[0], BLC[0] and a connection to the drain region of transistor 52. The term "contact" is commonly understood to refer to an opening through an insulator for a connection between metal or polysilicon in one level to silicon in another level, while the term "via" is commonly understood to refer to an opening through an insulator for a connection between two metal levels. For purposes of this specification, however, the term "contact opening" will be used to generically refer to both types of openings or connections, i.e., inclusive of both contacts to silicon and vias between metal layers. In this embodiment, at most one such contact opening will be present within a given ROM cell 50.

The three bit lines BLA[0], BLB[0], BLC[0] associated with column 0 of memory array 40 are received by column select circuit $42_0$. In this embodiment, column select circuit $42_0$ includes four MOS transistors 55a through 55d, each of which has its source connected to sense line SL. Transistor 55a has its drain connected to bit line BLC[0] and its gate receiving column select signal Y[0], and transistor 55b has its drain connected to bit line BLA[0] and its gate also receiving column select signal Y[0]. Transistor 55c has its drain connected to bit line BLB[0] and its gate receiving column select signal Y[1], and transistor 55d has its drain connected to bit line BLC[0] and its gate receiving column select signal Y[1]. In operation, both of transistors 55a, 55b are turned on by an active high level on column select signal Y[0] from column decoder 46, resulting in a logical combination (in this case, a "wired-NOR") of bit lines BLA[0] and BLC[0] at sense line SL (i.e., either of bit lines BLA[0] and BLC[0] at a low level will pull sense line SL low). Similarly, an active high level at column select signal Y[1] turns on both of transistors 55c, 55d, resulting in a wired-NOR of bit lines BLB[0] and BLC[0] at sense line SL. Alternatively, the architecture may be arranged to obtain a logical combination of the selected bit line pair other than a wired-NOR. Column select circuit $42_1$ is similarly constructed and operates similarly as column select $42_0$, but receives column select signals Y[2], Y[3] representative of the column address of column 1, from column decoder 46. Column select circuit $42_1$ is also connected to the same sense line SL as column select circuit $42_0$. Indeed, the combination of column select circuits $42_0$, $42_1$ may be considered and realized as a single multiplexer circuit.

In this embodiment of the invention, precharge circuit 47 is constructed as a p-channel MOS transistor with its source/drain path connected between sense line SL and power supply voltage $V_{dd}$, or another voltage level to which bit lines BLA[n-1:0], BLB[n-1:0], BLC[n-1:0] are to be precharged, and receives precharge control signal PRE at its gate. Alternatively, as mentioned above, bit lines BLA[n-1:0], BLB[n-1:0], BLC[n-1:0] may be directly precharged from the opposite side of array 40, rather than through column select circuit 42 as in the example of FIG. 4. In either case, "pull-down" n-channel MOS transistors (not shown) may be connected to bit lines BLA[n-1:0], BLB[n-1:0], BLC[n-1:0] on either side of column select circuits $42_0$, $42_1$, to restore a low level at the end of a read cycle; such pull-down devices are conventional in the art for precharge-high ROMs.

In operation, row decoder 45 and column decoder 46 receive the row and column addresses, respectively, of one or more ROM cells 50 to be read in the current read cycle. The row address will indicate which of word lines WL[m] will be energized to accomplish the read. In this embodiment of the invention, the column address will indicate which column select signal Y[0], Y[1], Y[2], Y[3] will be selected, for example according to the two least significant bits of a column address. The selected column select signal Y[0], Y[1], Y[2], Y[3] will in turn select the corresponding one of column select circuits $42_0$, $42_1$ and its corresponding group of bit lines BLA[n-1:0], BLB[n-1:0], BLC[n-1:0].

Upon selection of the addressed column, precharge is accomplished by assertion of one of its column select signals Y. For example, column 0 is selected by column decoder 46 asserting column select signal Y[0] to an active high level, turning on transistors 55a, 55b of column select circuit $42_0$ to connect bit lines BLA[0], BLC[0] to sense line SL. This selection is followed by control circuitry (not shown) driving precharge control signal PRE_ to an active low level, which applies power supply voltage $V_{dd}$ to bit lines BLA[0] and BLC[0]. After a time sufficient to raise the bit line voltage to the desired level, precharge control signal PRE_ is deactivated, allowing bit lines BLA[0] and BLC[0] to float at their precharged voltage. All word lines WL[m] have been at an inactive low level during this precharge operation, and column select signal Y[0] remains asserted.

Row decoder 45 then asserts the one of word lines WL[m] corresponding to the addressed row, which will turn on transistors 52 in each of ROM cells 50 in that corresponding row of array 40. For example, if word line WL[0] is energized, transistors 52 in cells $50_{0,0}$ and $50_{0,1}$ will be turned on. Because cell $50_{0,0}$ is in the selected column in this example, the programmed data state of its switch 54 will be communicated to its precharged bit lines BLA[0], BLC[0]. If switch 54 of ROM cell $50_{0,0}$ is programmed to connect the drain of transistor 52 to bit line $BLA_0$, bit line BLA[0] will be pulled low by transistor 52. Precharged bit line BLC[0] will be pulled low by bit line BLA[0] going low, since both of transistors 44a, 44b are turned on by the asserted column select signal Y[0]. Similarly, if switch 54 of cell $50_{0,0}$ is programmed to connect the drain of transistor 52 to bit line BLC[0], bit line BLC[0] will instead be discharged (as will bit line BLA[0] via column select circuit $42_0$). If switch 54 of ROM cell $50_{0,0}$ is programmed to connect the drain of transistor 52 to bit line BLB[0] or to none of bit lines BLA[0], BLB[0], BLC[0], then both of precharged bit lines BLA[0], BLC[0] will remain at their precharged level upon word line WL[0] driven active high. Sense amplifier 44 is enabled after sufficient time for the voltage to develop at sense line SL, at which time the wired-NOR of bit lines BLA[0] and BLC[0] is sensed as data bit Q. Column select signal Y[0] and word line WL[0] are then de-energized. Data bit Q read in this cycle, with column select signal Y[0] asserted, corresponds to one of the two data bits stored by cell $50_{0,0}$ in this embodiment of the invention, and may be communicated by sense amplifier 44 on data bus DATA_OUT.

At such time as the other data bit stored by cell $50_{0,0}$ is desired to be read, this process is repeated but with column select signal Y[1] asserted by column decoder 44, turning on transistors 55c and 55d in column select circuit $42_0$ and coupling bit-lines BLB[0] and BLC[0] to sense line SL. Precharge signal PRE is driven active low to apply power supply voltage $V_{dd}$ to these bit lines BLB[0] and BLC[0] for the desired precharge time, and is then released as before. Word line WL[0] is asserted, turning on transistor 52 in cells 50 in its row 0, including cell $50_{0,0}$; column select signal Y[1] remains asserted so that both of bit lines BLB[0], BLC[0] are connected to sense line SL. The programmed state of switch 54 in this selected cell $50_{0,0}$ then determines whether bit lines BLB[0], BLC[0] are discharged through its transistor 52. The wired-NOR of bit lines BLB[0] and BLC[0] at sense line SL is then sensed by sense amplifier 46 as data bit Q, and column select signal Y[1] and word line WL[0] are de-energized. Data bit Q that is read in this cycle, with column select signal Y[1] asserted, corresponds to the other one of the two data bits stored by cell $50_{0,0}$ in this embodiment of the invention.

According to this embodiment of the invention, the encoding of the programmed position of switch 54 in ROM cell $50_{0,0}$ into the two stored data bits correspond to the assignment of bit lines BLA[0], BLB[0], BLC[0] into the pairs selected by column select signals Y[0], Y[1]. In this example, the four available data states of the two data bits stored by ROM cell $50_{0,0}$ corresponds to the following states of switch 54:

| Bit line connected to transistor 52 | Data bit Q for Y[0] asserted | Data bit Q for Y[1] asserted |
| --- | --- | --- |
| BLC | 0 | 0 |
| BLB | 1 | 0 |
| BLA | 0 | 1 |
| none | 1 | 1 |

For example, if cell $50_{0,0}$ is programmed to connect bit line BLC[0] to the drain of transistor 52, sense line SL will be at a low level both when column select signal Y[0] is energized, and when column select signal Y[1] is energized. If cell $50_{0,0}$ is programmed with bit line BLB[0] connected to transistor 52, then sense line SL will remain high when column select signal Y[0] is energized, but will be pulled low when column select signal Y[1] is energized. If cell $50_{0,0}$ is programmed with bit line BLA[0] connected to transistor 52, then sense line SL will be pulled low with column select signal Y[0] energized, but will remain high when column select signal Y[1] is energized. And if transistor 52 of ROM cell $50_{0,0}$ is connected to none of bit lines BLA[0], BLB[0], BLC[0], sense line SL will remain at its high level while both of column select signals Y[0] and Y[1] are respectively energized.

In this example, sense amplifier 44 is shared by columns 0 and 1 (and perhaps other columns). As such, during the sensing of column 0, column select signals Y[2], Y[3] remain inactive low, and the states of bit lines BLA[1], BLB[1], BLC[1] do not interfere with the level at sense line SL. In this example, column select circuits $42_0$, $42_1$ together correspond to a 4:1 multiplexer (i.e., multiplex factor MF=4), considering that each cell 50 stores two data states, so that each physical column corresponds to two "logical" columns. The extent to which sense amplifiers 44 are shared (i.e., the number of separate sense amplifiers 44 for array 40) depends on the desired data word width to be read in each cycle, as reflected by the column sense architecture. At one extreme, one sense amplifier 44 may be provided for each column for a maximum width data word; at the other extreme, one sense amplifier 44 may be shared by all columns in array 40 for a data word of two bits.

Figure 5A:
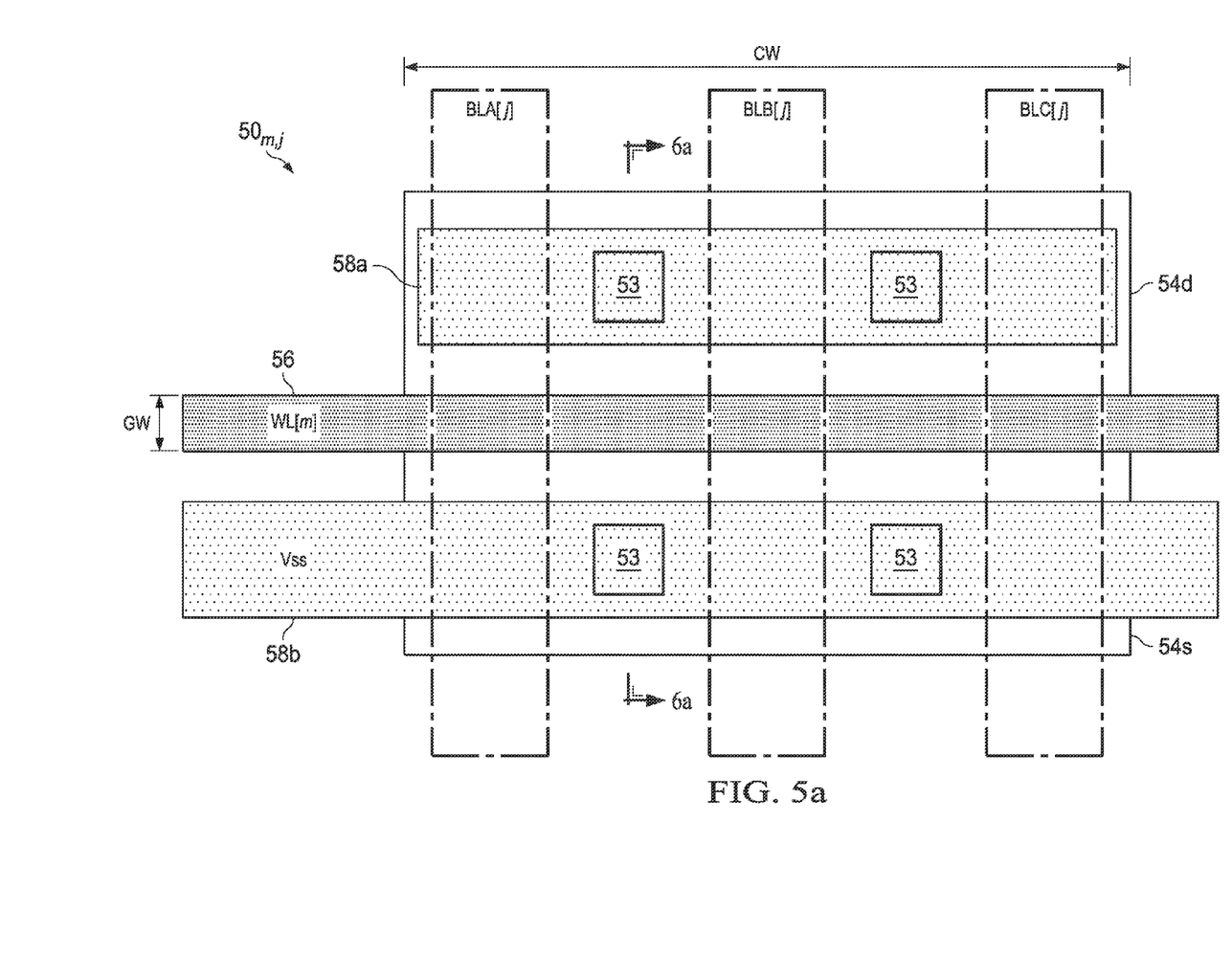
FIGS. 5a and 5b are plan views of a portion of an integrated circuit surface at which a ROM cell constructed according to an embodiment of the invention is realized.
Figure 5B:
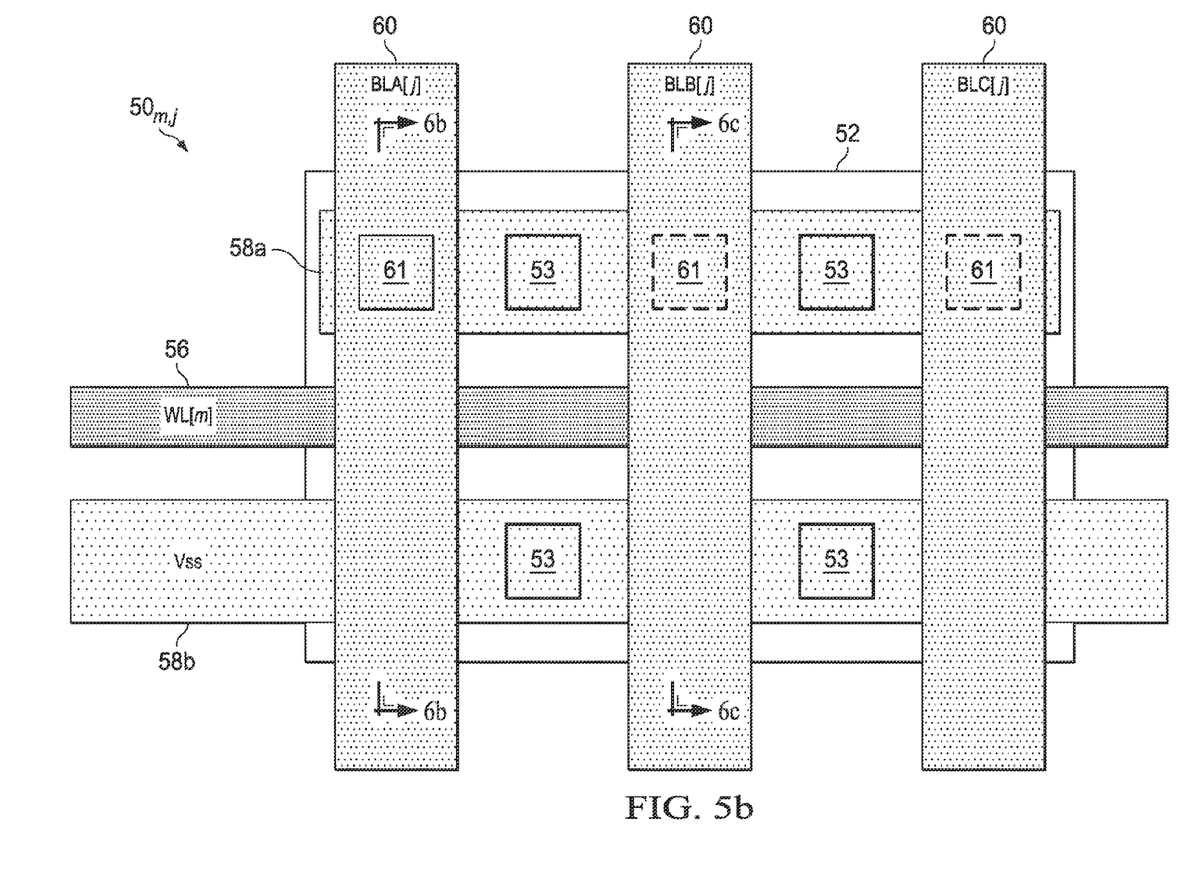
Figure 6A:
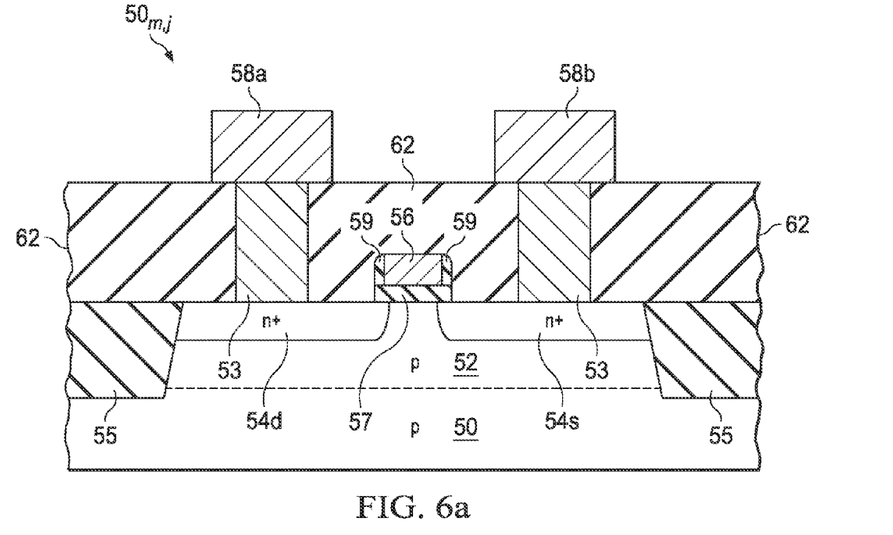
FIGS. 6a through 6c are cross-sectional views of the ROM cell of FIGS. 5a and 5b, according to that embodiment of the invention.
Figure 6B:
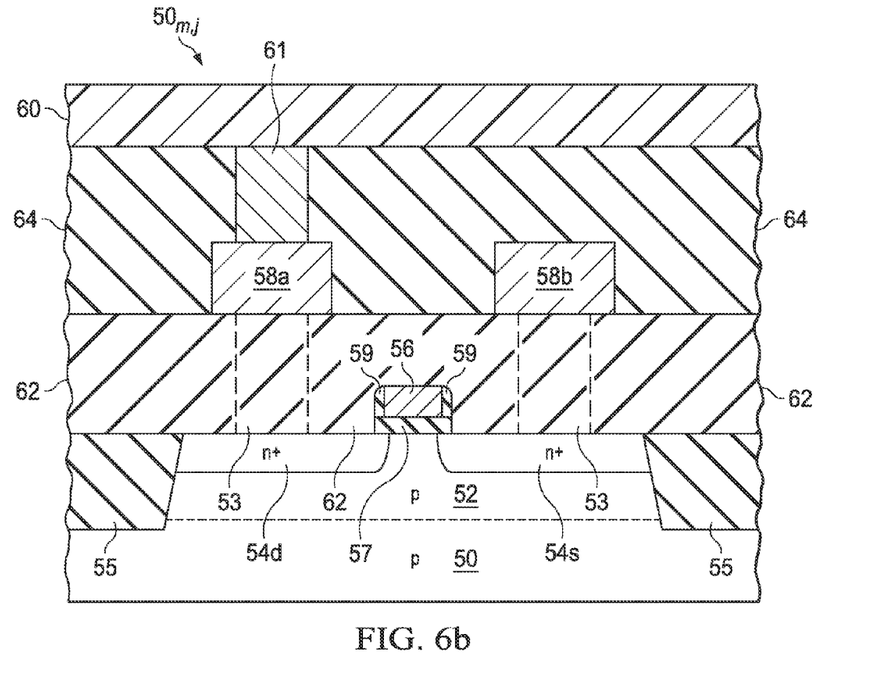
Figure 6C:
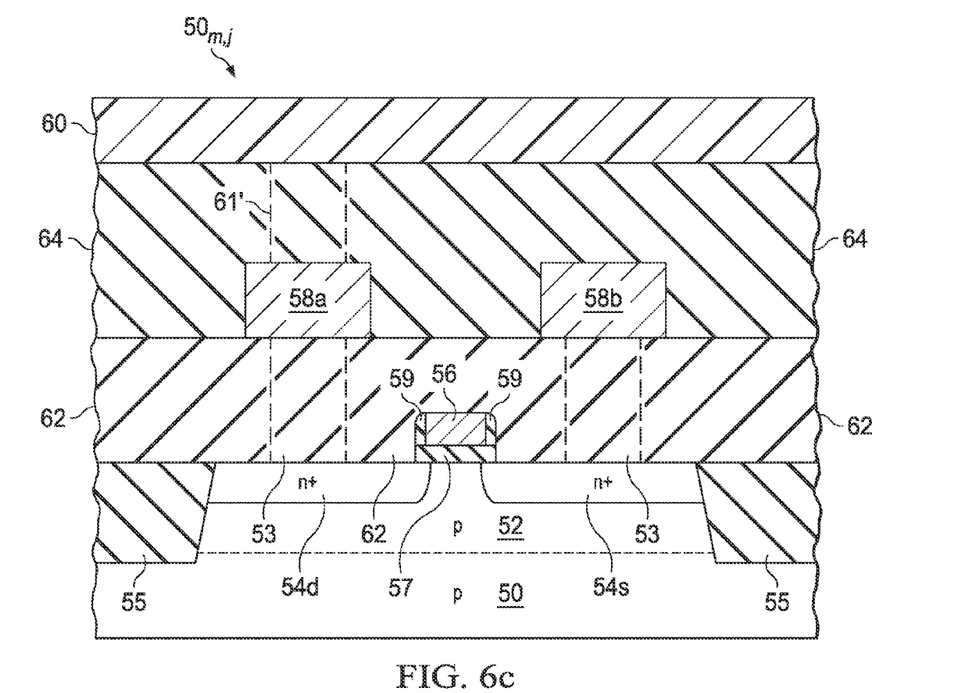

As mentioned above, each ROM cell 50 of memory array 40 is programmed (i.e., its switch 54 is set) by the presence or absence of a contact opening for a connection between the drain region of transistor 52 and at most one of three overlying conductors corresponding to bit lines BLA[1], BLB[1], BLC [1]. Referring now to FIGS. 5a and 5b in combination with FIGS. 6a through 6c, an example of the physical construction of ROM cell $50_{m,j}$ according to an embodiment of the invention will now be described. FIGS. 5a and 6a illustrate ROM cell $50_{m,j}$, in plan and cross-sectional views, respectively, prior to the formation of bit lines BLA[j], BLB[j], BLC[j] for its column j. FIGS. 5b, 6b, and 6c illustrate ROM cell $50_{m,j}$, after bit line formation.

Referring to FIGS. 5a and 6a, ROM cell $50_{m,j}$ is formed at the surface of p-type well 52, which in this example is a conventional well region of the desired dopant concentration formed into p-type substrate 50. The active region at which cell $50_{m,j}$ is formed is defined by surrounding isolation dielectric structures 55, for example silicon dioxide formed according to conventional shallow trench isolation techniques. Alternatively, p-type well 52 may be omitted, in which case ROM cell $50_{m,j}$ is formed at the surface of p-type substrate 50 itself.

An n-channel MOS transistor (corresponding to transistor 52) is defined by polysilicon gate electrode 56 overlying the surface of p-type well 52, separated from that surface by gate dielectric 57. This transistor also includes n+ source and drain regions 54s, 54d, respectively, formed into p-type well 52 on either side of polysilicon gate electrode 56, for example in the well-known self-aligned manner. If desired, sidewall dielectric 59 may be included, as shown in FIG. 6a, to define source and drain regions 54s, 54d with lightly-doped drain extensions, as known in the art. Polysilicon gate electrode 56 corresponds to word line WL[m] in memory array 40, and as such this element will extend across each of those cells 50 that are in the same row m as cell $50_{m,j}$.

In this embodiment of the invention, source region 54s is biased to ground voltage $V_{ss}$ by metal conductor 58b and contact openings 53. Metal conductor 58b runs parallel to gate electrode 56 in this example, and is separated from the surface of source region 54s by interlevel dielectric layer 62. Contact openings 53 are formed through dielectric layer 62 at selected locations overlying source region 54s, through which the metal of conductor 58b extends and makes ohmic contact to source region 54s. In this embodiment of the invention, the same metal layer forms metal conductor 58a within the area of ROM cell $50_{m,j}$ and overlying drain region 54d; contact openings 53 are also etched through dielectric layer 62 to allow metal conductor 58a to make ohmic contact to drain region 54d. Metal conductors 58a, 58b, and contact openings 53 through dielectric layer 62 are formed by conventional deposition and photolithography processes, as known in the art.

FIGS. 5b, 6b, and 6c illustrate ROM cell $50_{m,j}$ after the formation of metal conductors 60. As shown in FIG. 5b, three metal conductors 60 extend across the area of cell $50_{m,j}$, in a direction perpendicular to gate electrode 56 (i.e., word line $WL_m$). These three metal conductors 60 correspond to bit lines BLA[j], BLB[j], BLC[j], and all three extend across each of those cells 50 in the same column j as cell $50_{m,j}$. In this embodiment of the invention, as shown in FIGS. 6b and 6c, metal conductors 60 are in a different metal level, in this case a higher metal level, than metal conductors 58a, 58b. Second interlevel dielectric layer 64 is disposed over metal conductors 58a, 58b, with metal conductors 60 formed in a metal level overlying that second interlevel dielectric layer 64. Source/drain contact openings 53 through dielectric layer 62 are shown in FIGS. 6b and 6c in shadow, to clarify that metal conductors 58a, 58b are in contact with source/drain regions 54n, but at a different depth into the page.

According to this embodiment of the invention, the data state stored by ROM cell $50_{m,j}$ is determined by the presence or absence of a connection between the drain region 54d and at most one of bit lines BLA[j], BLB[j], BLC[j]. In this example, ROM cell $50_{m,j}$ has been programmed by the placement of via 61 between the metal conductor 60 corresponding to bit line $BLA_{j/k}$ and metal conductor 58a, which in turn is in contact with drain region 54d. According to embodiments of this invention, this placement of at most one via 61 is accomplished by the generating of a photomask or reticle pattern for ROM cell $50_{m,j}$ at the appropriate via level that defines an opening to be present at the location at which metal conductor 60 associated with bit line BLA[j] crosses metal conductor 58a, but does not define vias at locations 61' at which metal conductors 60 for bit lines BLB[j] and BLC[j] cross metal conductor 58, as shown in FIG. 5b.

FIG. 6b shows, in cross-section, the location of via 61 through dielectric layer 64, filled with a metal or other conductive material to form a conductive connection between metal conductor 58a and metal conductor 60. The fill metal within contact via 61 may be the same metal, deposited in the same layer, as that of metal conductor 60. Alternatively, one or more layers of a fill metal or other conductor, such as tungsten, polysilicon, and the like, may be deposited within via 61 and then etched back as necessary. Conventional techniques for forming metal-to-metal connections through vias 61 are well-known in the art, and are suitable for this embodiment of the invention.

FIG. 6c shows, in cross-section, via location 61' at which metal conductor 60 for bit line BLB[j] crosses over metal conductor 58, and at which no contact opening is formed. According to the truth table described above, the programming of ROM cell $50_{m,j}$ to have a connection between drain region 54d and bit line BLA[j], but no connections between drain region 54d and either of bit lines BLB[j], BLC[j], indicates that the two data bits read from ROM cell $50_{m,j}$ when selected will take the respective values of "0" and "1".

Following the stage in the manufacture shown in FIGS. 5b, 6b, and 6c, deposition of additional dielectric material, etching of contact openings (i.e., vias), deposition of metal plugs, definition of metal conductors, and other "back-end" processing is performed as desired for the particular construction of the integrated circuit. As known in the art, the number of metal layers (and polysilicon layers, if desired) will be determined by the particular design and desired process technology and cost factors.

It is contemplated that variations and alternatives to the construction and arrangement of ROM cells described above will be apparent to those skilled in the art having reference to this specification, such variations and alternatives remaining within the scope of this invention. For example, p-channel MOS transistors may be used to realize the ROM cells, rather than the n-channel MOS transistors as described above. It is contemplated, however, that n-channel MOS transistors typically have larger current drive characteristics than p-channel devices according to current technology. Other variations and alternatives, particularly in the ROM cell construction, will be apparent to those skilled in the art having reference to this specification.

According to embodiments of this invention, a mask-programmable ROM cell is provided that can source strong read current while providing scalability as transistor feature sizes shrink at advanced technology nodes. FIG. 5a illustrates, by way of the example of ROM cell $50_{m,j}$, that the n-channel MOS transistor has a channel width CW that is several times that of gate width GW, extending under all three of bit lines BLA[j], BLB[j], BLC[j]. The width/length ratio of this transistor is significant greater than that of conventional minimum feature size transistors, for example on the order of three times that of conventional ROM cells coupled to a single bit line structure, such as shown in FIG. 1b described above. This improved read current enables the chip area required for the ROM memory array in an integrated circuit to scale with the technology node scaling factor, without requiring relaxation in performance requirements, reduction in permissible bit line lengths, or other less-preferred options. And while the overall size of the ROM cell is increased on a per-cell basis, each ROM cell according to embodiments of this invention stores two bits of data and is also scalable to minimum feature sizes for the technology node. It is therefore contemplated that the array density (bits per unit area) of embodiments of this invention will be at least that of conventional ROM arrays.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A read-only memory (ROM) in an integrated circuit, comprising:
    an array of memory cells arranged in rows and columns;
    a plurality of word lines, each associated with a row of memory cells in the array; and
    a plurality of bit lines, arranged in groups consisting of first, second, and third bit lines, each group associated with a column of memory cells in the array;
    a sense amplifier, associated with one or more columns of memory cells in the array; and
    a plurality of column select circuits, each associated with one of the columns, for coupling first and second pairs of the first, second and third bit lines associated with the column to the sense amplifier;
    wherein each of the memory cells comprises:
    a transistor having source and drain regions disposed on opposing sides of one of the word lines associated with the row of the memory cell; and
    at most one connection between the drain region of the transistor and the first, second, and third bit lines associated with the column of the memory cell.

2. The ROM of claim 1, wherein each of the memory cells further comprises:
    a bias conductor in electrical contact with the source region.

3. The ROM of claim 2, wherein the bias conductor comprises:
    a reference voltage conductor extending across, and in electrical contact at the bias contact with, the source region of each of a plurality of memory cells.

4. The ROM of claim 1, wherein the source and drain regions of the transistor are formed at a semiconducting surface of the integrated circuit;
    wherein each of the memory cells further comprises:
    a dielectric material disposed between the first, second, and third bit lines associated with the column of the memory cell, and the drain region of the transistor; and
    wherein the at most one connection comprises an opening through the dielectric material, the opening filled with a conductive material and disposed at a location at which the corresponding one of the first, second, and third bit lines associated with the column of the memory cell overlie the drain region.

5. The ROM of claim 1, wherein each memory cell further comprises:
    a strap conductor disposed above the drain region and below each of the first, second, and third bit lines, the strap conductor making contact to the drain region at one or more contact locations; and
    wherein the at most one connection is between the strap conductor and one of the first, second, and third bit lines associated with the column of the memory cell.

6. The ROM of claim 5, wherein each memory cell further comprises:
    a dielectric material disposed between the first, second, and third bit lines associated with the column of the memory cell, and the strap conductor; and
    wherein the at most one connection comprises an opening through the dielectric material, the opening filled with a conductive material and disposed at a location at which the corresponding one of the first, second, and third bit lines associated with the column of the memory cell overlies the strap conductor.

7. The ROM of claim 1, wherein each of the column select circuits comprises:
    first and second transistors, each having conduction paths coupled on one side to the sense amplifier and on another side to the first and third bit lines for the associated column, respectively, and each having a gate electrode coupled to receive a first column select signal; and
    third and fourth transistors, each having conduction paths coupled on one side to the sense amplifier and on another side to the second and third bit lines for the associated column, respectively, and each having a gate electrode coupled to receive a second column select signal.

8. The ROM of claim 7, wherein the location of the at most one filled opening corresponds to a two-bit data state stored by the memory cell, the two-bit data state representing any one of first, second, third, and fourth values;
    wherein the first value corresponds to the memory cell in a selected row and a selected column having its connection between the drain region and the third bit line associated with its column;
    wherein the second value corresponds to the memory cell in the selected row and the selected column having its connection between the drain region and the second bit line associated with its column;
    wherein the third value corresponds to the memory cell in the selected row and the selected column having its connection between the drain region and the first bit line associated with its column;
    and wherein fourth value corresponds to the memory cell in the selected row and the selected column having no connection between the drain region and any of the first, second, and third bit lines.

9. A read-only memory (ROM) in an integrated circuit, comprising:
    an array of memory cells arranged in rows and columns;
    a plurality of word lines, each associated with a row of memory cells in the array; and a plurality of bit lines, arranged in groups consisting of first, second, and third bit lines, each group associated with a column of memory cells in the array;

a sense amplifier, associated with one or more columns of memory cells in the array; and a plurality of column select circuits, each associated with one of the columns, for coupling first and second pairs of the first, second and third bit lines associated with the column to the sense amplifier;

wherein each of the memory cells comprises:

a transistor having a source region biased to a reference voltage, a gate electrode comprising the word line of the row associated with the memory cell, and a drain region connected to at most one of the first, second, and third bit lines associated with the column of the memory cell.

10. The ROM of claim 9, wherein at least one of the memory cells comprises a transistor with its drain region connected to none of the first, second, and third bit lines associated with its column.

11. The ROM of claim 9, wherein each of the column select circuits comprises:

first and second transistors, each having conduction paths coupled on one side to the sense amplifier and on another side to the first and third bit lines for the associated column, respectively, and each having a gate electrode coupled to receive a first column select signal; and third and fourth transistors, each having conduction paths coupled on one side to the sense amplifier and on another side to the second and third bit lines for the associated column, respectively, and each having a gate electrode coupled to receive a second column select signal.

12. The ROM of claim 11, wherein each memory cell stores a two-bit data state representing any one of first, second, third, and fourth values;

wherein the first value corresponds to the memory cell in a selected row and a selected column having its drain region connected to the third bit line associated with its column;

wherein the second value corresponds to the memory cell in the selected row and the selected column having its drain region connected to the second bit line associated with its column;

wherein the third value corresponds to the memory cell in the selected row and the selected column having its drain region connected to the first bit line associated with its column;

and wherein the fourth value corresponds to the memory cell in the selected row and the selected column having its drain region connected to none of the first, second, and third bit lines.

13. A method of operating a read-only memory (ROM) to read a data state of a ROM cell in a selected row and a selected column of an array of ROM cells, each ROM cell comprising a transistor having a source region biased to a reference voltage, a gate electrode receiving a word line associated with a row of ROM cells, and a drain region connected to at most one of first, second, and third bit lines associated with the column of the ROM cell, the method comprising the steps of:

energizing a word line for the selected row of ROM cells;

then coupling the first and third bit lines for the selected column to a sense line; and then sensing a logic level at the sense line.

14. The method of claim 13, further comprising:

then coupling the second and third bit lines for the selected column to the sense line; and then sensing a logic level at the sense line.

15. The method of claim 13, further comprising:

prior to the energizing step, precharging the first and third bit lines to a precharge voltage different from the reference voltage.

16. The method of claim 14, wherein the coupling of the first and third bit lines to the sense line performs a wired-NOR of logic levels at the first and third bit lines.

17. The method of claim 16, further comprising:

precharging the second and third bit lines to a precharge voltage different from the reference voltage;

then energizing the word line for the selected row;

then coupling the second and third bit lines for the selected column to the sense line; and then sensing a logic level at the sense line;

and wherein the coupling of the second and third bit lines to the sense line performs a wired-NOR of logic levels at the second and third bit lines.

18. The method of claim 17, wherein a second column of ROM cells is associated with the sense amplifier;

and further comprising:

during the step of coupling the first and third bit lines for the selected column to the sense line, isolating the first, second, and third bit lines for the second column from the sense line; and during the step of coupling the second and third bit lines for the selected column to the sense line, isolating the first, second, and third bit lines for the second column from the sense line.

19. The method of claim 13, further comprising:

decoding a column address;

wherein the steps of coupling the first and third bit lines is performed for the selected column responsive to the decoding step indicating selection of that column.

* * * * *